(12) United States Patent
Mevellec et al.

(10) Patent No.: US 8,883,641 B2
(45) Date of Patent: Nov. 11, 2014

(54) SOLUTION AND METHOD FOR ACTIVATING THE OXIDIZED SURFACE OF A SEMICONDUCTOR SUBSTRATE

(75) Inventors: Vincent Mevellec, Chaville (FR); Dominique Suhr, Chatenay Malabry (FR)

(73) Assignee: Alchimer, Massy (FR)

( * ) Notice: Subject to any disclaimer, the term of this patent is extended or adjusted under 35 U.S.C. 154(b) by 417 days.

(21) Appl. No.: 13/393,917

(22) PCT Filed: Sep. 30, 2010

(86) PCT No.: PCT/EP2010/064565
§ 371 (c)(1),
(2), (4) Date: Apr. 18, 2012

(87) PCT Pub. No.: WO2011/039310
PCT Pub. Date: Apr. 7, 2011

(65) Prior Publication Data
US 2012/0196441 A1    Aug. 2, 2012

(30) Foreign Application Priority Data

Sep. 30, 2009  (FR) ..................................... 09 56800
Dec. 30, 2009  (FR) ..................................... 09 59677

(51) Int. Cl.
*H01L 21/44*  (2006.01)
*C23C 18/32*  (2006.01)
*C23C 18/18*  (2006.01)
*C23C 18/16*  (2006.01)

(52) U.S. Cl.
CPC ............. *C23C 18/1882* (2013.01); *C23C 18/32* (2013.01); *C23C 18/1879* (2013.01); *C23C 18/1696* (2013.01); *C23C 18/1653* (2013.01)

USPC ... 438/678; 438/770; 106/1.28; 257/E21.271; 257/E21.295

(58) Field of Classification Search
None
See application file for complete search history.

(56) References Cited

U.S. PATENT DOCUMENTS 5,264,288 A    11/1993  Das et al.

FOREIGN PATENT DOCUMENTS

EP    0 092 601    11/1983

OTHER PUBLICATIONS

McDonald et al., ""Click" Immobilization of Organometallic Pincer Catalysts for C-C Coupling Reactions", Organomettallics 2009,28, (pp. 4689-4699).
Vassylyev et al., Catalytic properties of several supported Pd (II) complexes for Suzuki coupling reactions, Tetrahedron Letters, Elsevier, vol. 46, No. 40, Oct. 3, 2005, (pp. 6865-6869).

*Primary Examiner* — Yasser A Abdelaziez
(74) *Attorney, Agent, or Firm* — Hamre, Schumann, Mueller & Larson, P.C.

(57) ABSTRACT

The present invention relates to a solution and a method for activating the oxidized surface of a substrate, in particular of a semiconducting substrate, for its subsequent coating by a metal layer deposited by the electroless method.
According to the invention, this composition contains:
 A) an activator consisting of one or more palladium complexes;
 B) a bifunctional organic binder consisting one or more organosilane complexes;
 C) a solvent system consisting one or more solvents for solubilizing the said activator and the said binder.

10 Claims, 1 Drawing Sheet

Figure 1:
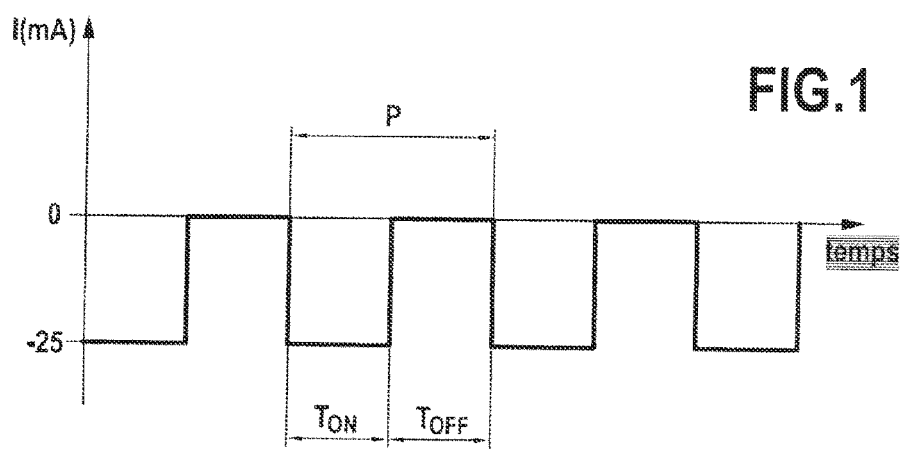

SOLUTION AND METHOD FOR ACTIVATING THE OXIDIZED SURFACE OF A SEMICONDUCTOR SUBSTRATE

The present invention generally relates to the fabrication of electronic devices, such as in particular integrated circuits, in particular three-dimensional, and is related in particular to a solution of a method for activating a substrate comprising an oxidized dielectric surface, for its subsequent coating by a metal layer deposited using an electroless method.

The invention is essentially applicable in the field of microelectronics for the metallization, in particular with copper, of through vias (also called through silicon vias or through wafer vias or through wafer interconnects) which are keystones for three-dimensional (3D) or vertical integration of electronic chips or dies. The invention is also applicable in other fields of electronics in which a substrate having through vias that are covered with an insulating layer and with a discontinuous barrier layer must be treated so as to obtain a continuous barrier layer over the entire surface of the vias. In this context, mention may be made of the fabrication of interconnects in printed circuits (also called printed circuit boards or printed wiring boards) or the fabrication of passive components, such as indicators, or electromechanical components in integrated circuits or microsystems (also called microelectromechanical systems).

Current electronic systems are made up for the most part from several integrated circuits, or components, and each integrated circuit fulfils one or more functions. For example, a computer comprises at least one microprocessor and several memory circuits. Each integrated circuit usually corresponds to an electronic chip in its own package. The integrated circuits are soldered to or plugged into, for example, a printed circuit board or PCB, which ensures connection between the integrated circuits.

The continual need to increase the functionality density of electronic systems has lead to an approach called "three-dimensional (3D) integration" or "vertical integration" is characterized by the fact that the chips are superposed and connected together by vertical interconnects. The stack obtained thus comprises several layers or strata of active components or chips and constitutes a 3D integrated circuit (or 3D IC).

After the chips have been stacked, for example by bonding them together, they may be individually connected to the pins of the package by wire bonding. The chips may generally be interconnected by employing through vias.

The elementary technologies needed to produce three-dimensional integrated circuits comprise in particular the thinning of silicon wafers, the alignment between the layers, the bonding of the layers, and the etching and metallization of the through vias within each layer.

Silicon wafers may be thinned before the through vias are fabricated (e.g. U.S. Pat. No. 7,060,624 and U.S. Pat. No. 7,148,565).

Alternatively the vias may be etched and metallized before the silicon wafer is thinned (e.g. U.S. Pat. No. 7,060,624 and U.S. Pat. No. 7,101,792). In this case, closed or "blind" vias are etched in the silicon and then metallized down to the desired depth before the silicon wafer is thinned, so as to obtain through vias.

The good electrical conductivity of copper and its high resistance to electromigration, i.e. the small amount of copper atoms that migrate under the effect of the electric current density, which can be in important cause of failure, make copper in particular a material of choice for metallizing the through vias.

The through vias of 3D integrated circuits are generally produced in a manner similar to the "damascene" process used in the microelectronics field for the fabrication of interconnects in integrated circuits, in a succession of steps comprising:

etching of the vias in or through the silicon wafer;
deposition of an insulating dielectric layer;
deposition of a barrier layer or liner, serving to prevent the migration or diffusion of copper;
deposition of a copper seed layer;
filling of the vias by copper electrodeposition; and
removal of the excess copper by mechano-chemical polishing.

The insulating dielectric layer may be inorganic (generally consisting of silicon dioxide $SiO_2$, silicon nitride SiN or aluminium oxide, for example), deposited by CVD or another process, or may be organic (parylene C, N or D, polyimide, benzocyclobutene or polybeonzoxazole for example) deposited by dipping in a liquid medium, or using the SOG (spin-on-glass) method.

The copper diffusion barrier layer generally consists of tantalum (Ta), titanium (Ti), tantalum nitride (TaN), titanium nitride (TiN), a titanium-tungsten alloy (TiW), tungsten carbonitride (WCN) or a combination of these materials, and generally deposited in the vapour phase (PVD, CVD, ALD).

This barrier layer may be formed from other metals such as, in particular, a nickel-based or cobalt-based alloy by the electroless method.

Thus US patent application US 2005/0110149 describes a method for preparing a semiconductor device comprising a silica-based intermediate insulating layer, covered with a monomolecular film based on organic silane modified at the surface by a compound containing palladium, the film thus modified being covered by an electroless method with a cobalt-based or nickel-based layer forming a barrier on which the copper layer can be deposited by electrodeposition.

A substantially similar method is described in US patent application 2008/0079154 which, in order to improve the adhesive properties between the various layers of the semiconductor device, recommends performing two consecutive electroless treatments by a nickel-based compound (NiB), then by a cobalt-based compound (CoWP).

The method described in these prior patent applications requires the use of two different solutions and two different treatments to fix, on the intermediate insulating surface, the palladium compound serving as activator for the electroless deposition.

Recently, patent application WO 2009/086230 proposed a solution for activating an oxidized dielectric substrate in a single step for the subsequent deposition of a metal layer by the electroless method. This solution comprises a metal salt selected from a family of metals capable of initiating the electroless process, a compound of the silane type comprising a chelatant group capable of coordinating with the metal salt, a water-soluble solvent and a quantity of water generally between 1 and 10%. The water, mentioned as a major element of the invention, is used for solubilizing the metal salt in the activation solution. In fact, it has been found that the presence of water in a solution containing a silane compound leaves, in a relatively short time, for about 2 to 45 minutes depending on the solvent system used, to the polymerization of the silane and the subsequent abundant precipitation of the polysilane compound obtained. This precipitation causes the destabilization of the activation solution.

Patent application WO 2009/086230 mentions numerous possible combinations of a metal salt, solvent, silane and the quantity of water, and describes no detailed example of an activation solution.

It has appeared that some of these combinations, which are nevertheless preferably presented in this prior document, do not allow the subsequent deposition of a metal layer by the electroless method, and that those which do allow this are generally inactive after about 15 to 30 minutes, so that their use is inconceivable on the industrial scale.

The copper seed layer is generally prepared by physical or chemical deposition methods from a vapour phase. Considering the drawbacks resulting from these technologies, intensive research has been conducted to provide novel compositions for preparing a copper seed layer by an electrochemical method.

In this context, the present invention, in its currently preferred application, relates to the preparation of through vias of integrated circuits in three-dimensions in which the dielectric insulating layer is oxidized and must be covered by a metal layer using an electroless method, and then by a copper seed layer.

It is therefore an object of the present invention to solve the technical problem consisting of the supply of a composition which, within a single solution usable on the industrial scale, combines all the components for activating the oxidized dielectric surface of a substrate, such as a semiconductor substrate, for its subsequent coating by a metal layer deposited using an electroless method, then by a copper seed layer, giving rise to multilayer structures having excellent interlayer adhesion.

Thus, according to a first aspect, the present invention relates to a solution for activating the oxidized surface of a substrate, in particular a silicon-containing substrate, for its subsequent coating by a metal layer deposited using an electroless method,
characterized in that it contains:

A) an activator consisting of one or more palladium complexes selected from the group consisting of:

palladium complexes having the formula (I)

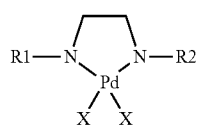

wherein:
R1 and R2 are identical and are —H; —CH$_2$CH$_2$NH$_2$; —CH$_2$CH$_2$OH;
or R1 is —H and R2 is —CH$_2$CH$_2$NH$_2$;
or R1 is —CH$_2$CH$_2$NH$_2$ and R2 is —CH$_2$CH$_2$NHCH$_2$CH$_2$NH$_2$;
or R1 is —H and R2 is —CH$_2$CH$_2$NHCH$_2$CH$_2$NHCH$_2$CH$_2$NH$_2$;
X is a ligand selected from the group consisting of Cl$^-$; Br$^-$; I$^-$; H$_2$O, NO$_3^-$; CH$_3$SO$_3^-$; CF$_3$SO$_3^-$; CH$_3$-Ph-SO$_3^-$; CH$_3$COO$^-$ palladium complexes having the formula IIa or IIb

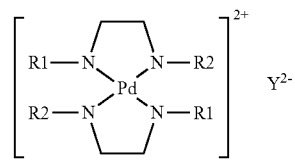

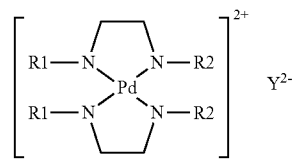

wherein:
R1 and R2 are as defined above and
Y is a counter-ion comprising two negative charges consisting of:
either two monoanions, preferably selected from the group consisting of Cl$^-$; PF$_6^-$; BF$_4^-$; NO$_3^-$; CH$_3$SO$_3^-$; CF$_3$SO$_3^-$; CH$_3$C$_6$H$_4$SO$_3^-$; CH$_3$COO$^-$;
or a dianion, preferably SO$_4^{2-}$.

B) a bifunctional organic binder consisting of one or more organosilane compounds having
the general formula:

$$\{X\text{-}(L)\}_{4-n}\text{-Si(OR)}_n \qquad (Va)$$

wherein:
X is a functional group selected from the group consisting of thiol, pyridyle, epoxy (oxacyclopropanyle), glycidyle, primary amine, chlorine and being able to react with palladium compounds of formula I;
L is a spacer selected from the group consisting of CH$_2$; CH$_2$CH$_2$; CH$_2$CH$_2$CH$_2$; CH$_2$CH$_2$CH$_2$CH$_2$; CH$_2$CH$_2$NHCH$_2$CH$_2$, CH$_2$CH$_2$CH$_2$NHCH$_2$CH$_2$; CH$_2$CH$_2$CH$_2$NHCH$_2$CH$_2$NHCH$_2$CH$_2$; CH$_2$CH$_2$CH$_2$NHCH$_2$CH$_2$CH$_2$CH$_2$CH$_2$; Ph; Ph-CH$_2$; et CH$_2$CH$_2$-Ph-CH$_2$; (Ph representing a phenyl moiety);
R is a group selected from the group consisting of CH$_3$—, CH$_3$CH$_2$—, CH$_3$CH$_2$CH$_2$—, (CH$_3$)$_2$CH—; and
n is an integer equal to 1, 2 or 3;
or the general formula:

$$(OR)_3Si\text{-}(L)\text{-}Si(OR)_3 \qquad (Vb)$$

wherein:
L is a spacer selected from the group consisting of CH$_2$CH$_2$CH$_2$NHCH$_2$CH$_2$NHCH$_2$CH$_2$CH$_2$ and CH$_2$CH$_2$CH$_2$—S—S—CH$_2$CH$_2$CH$_2$;
R is a group selected from the group consisting of CH$_3$—, CH$_3$CH$_2$—, CH$_3$CH$_2$CH$_2$—, (CH$_3$)$_2$CH—;

C) a solvent system consisting of one or more solvents suitable for solubilising said activator and said organosilane solvent.

In the following description, compounds having the formula (IIa) and (IIb) may be designated collectively by the name "compounds having the formula (II)".

According to a particular feature of the invention, this solution is water-free or comprises water at a concentration lower than 0.5%, preferably lower than 0.2% and still more preferably lower than 0.1% by volume. This limited quantity of water, combined with the complexed form of the activator, prevents any inactivation of the solution over time and therefore allows its use on the industrial scale.

According to another particular feature of the invention, this solution comprises:
- said activator at a concentration comprised between $10^{-6}$ M and $10^{-2}$ M, preferably between $10^{-5}$ M and $10^{-3}$ M, still more preferably between $5\times10^{-5}$ M and $5\times10^{-4}$ M;
- said binder at a concentration comprised between $10^{-5}$ M and $10^{-1}$ M, preferably between $10^{-4}$ M and $10^{-2}$ M, still more preferably between $5\times10^{-4}$ M and $5\times10^{-3}$ M.

In a completely original manner, the activator of the solution according to the invention consists of one or more palladium complexes having the formulas (I) and (II) defined above.

Complexes having formula (I) can be prepared by reacting a palladium salt having formula (III) with a nitrogenated bidentate ligand having the formula (IV) by the following reaction scheme:

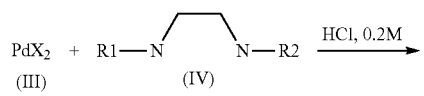

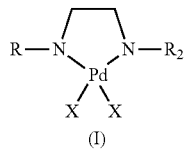

wherein X, R1 and R2 have the meanings given above.

More precisely, a palladium salt having the formula (III) is dissolved in an aqueous 0.2 M hydrochloric acid solution at a temperature comprised between 40° C. and 80° C., preferably about 60° C., for a period of 10 to 20 minutes, preferably about 20 minutes, to obtain the soluble complex having the formula $H_2PdCl_4$.

At the end of the reaction, an equivalent of a nitrogenated bidentate ligand having the formula (IV) is added to the reaction medium which is maintained at a temperature comprised between 40 and 80° C., preferably about 60° C., for a period of 1 to 3 hours, preferably about 2 hours, to yield the complex having the formula (I). The addition of the ligand causes a change in colour of the reaction medium.

The solvent is then evaporated and the solid residue is treated by recrystallization in a solvent such as ethanol for example.

Preferably, the starting palladium compound is palladium chloride $PdCl_2$.

Alternatively, the palladium salt having formula (III) can be replaced by a palladium salt having the formula $[PdX_4]^{2-}$, such as $K_2PdCl_4$, $Li_2PdCl_4$, $Na_2PdCl_4$ or $(NH_4)_2PdCl_4$.

As preferred examples of amine derivatives having the formula (IV) suitable for use in the context of the present invention, mention can be made in particular of the following compounds:

- diethylenetriamine (compound having formula (IV) where R1 is a hydrogen atom and R2 is a —$CH_2CH_2NH_2$ group);
- N,N'-Bis(2-hydroxyethyl)ethylenediamine (compound having formula (IV) where R1 and R2 are identical and are —$CH_2CH_2OH$).

A particularly preferred amine compound in the context of the present invention is diethylenetriamine.

Complexes having the formula (II) can be prepared similarly to the preparation of complexes having formula (I) by the following reaction scheme:

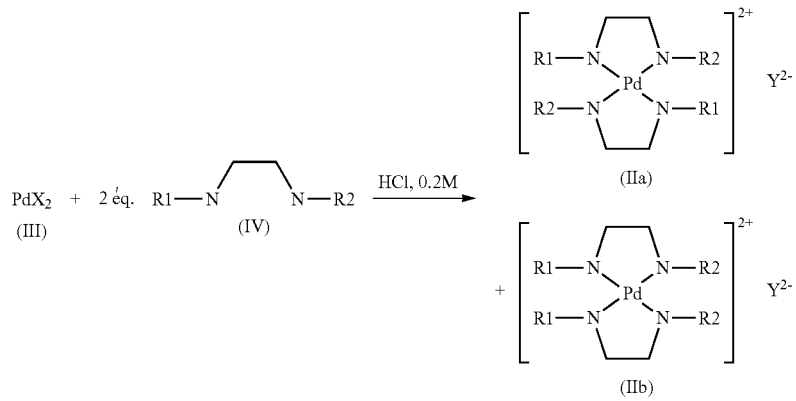

wherein X, R1 and R2 have the meaning indicated above.

More precisely, a soluble complex is formed having the formula $H_2PdCl_4$ in a manner identical to that described above.

At the end of the reaction, two equivalents of the nitrogenated bidentate ligand having formula (IV) are added to the reaction medium which is maintained at a temperature comprised between 60° C. and 80° C. for a period of 8 to 15 hours, preferably about 12 hours, to yield the complexes having a formula (IIa) and (IIb).

Alternatively, the complexes having formula (II) can be prepared from complexes having formula (I) by adding an equivalent of the nitrogenated bidentate ligand in an appropriate solvent and by maintaining the reaction medium at a temperature comprised between 60 and 80° C., preferably about 70° C., for period of 8 to 15 hours, preferably about 12 hours. In these two cases, the reaction can be facilitated by adding a silver salt to the reaction medium.

The reaction scheme given above shows that the reaction leads to two cis and trans complexes, which are the only complexes formed in the case in which R1 is H and R2 is —$CH_2CH_2NH_2$. A person skilled in the art will easily understand that statistical mixtures of several complexes can be obtained in the case in which R1 and R2 are both free radicals having a molecular weight equal to or higher than that of the —$CH_2CH_2NH_2$ group. It has been shown that such mixtures are usable on the industrial scale and must not necessarily be purified to yield the desired result.

The bifunctional organic binder, which constitutes one of the essential components of the inventive solution, consists of one or more compounds having formulas Va or Vb defined above. These compounds comprise at least one functional group of the alkoxysilane type suitable for forming a chemical bond with the oxidized surface of the substrate and at least one amine functional group suitable for forming a chemical bond with the palladium complex having formula (I) or (II) defined above.

These compounds provide good adhesion between the successive layers of a substrate having a surface formed of an oxide, in particular when this surface is subsequently covered with a metal layer, in particular of NiB forming a copper diffusion barrier, which is itself covered with a copper seed layer.

Compounds of formulas (Va) or (Vb) are for example selected from the group consisting of:
(3-Aminopropyl)triethoxysilane;
(3-Aminopropyl)trimethoxysilane;
m-Aminophenyltrimethoxysilane;
p-Aminophenyltrimethoxysilane;
p,m-Aminophenyltrimethoxysilane;
4-Aminobutyltriethoxysilane;
m, p (Aminoethylaminomethyl)phenethyltrimethoxysilane;
N-(2-Aminoethyl)-3-aminopropyltriethoxysilane;
N-(2-Aminoethyl)-3-aminopropyltrimethoxysilane,
2-(4-Pyridylethyl)triethoxysilane;
Bis(3-trimethoxysilylpropyl)ethylenediamine;
(3-Trimethoxysilylpropyl)diethylenetriamine;
N-(3-Trimethoxysilylethyl)ethylenediamine;
N-(6-Aminohexyl)aminopropyltrimethoxysilane;
(3-Glycidoxypropyl)trimethoxysilane;
(3-Glycidoxypropyl)triethoxysilane;
5,6-Epoxyhexyltriethoxysilane;
(3-Mercaptopropyl)trimethoxysilane;
(3-Mercaptopropyl)triethoxysilane;
Bis[3-(triethoxysilyl)propyl]disulfure;
3-Chloropropyltrimethoxysilane;
3-Chloropropyltriethoxysilane;
(p-Chloromethyl)phenyltrimethoxysilane;
m,p ((Chloromethyl)phenylethyl)trimethoxysilane.

As an example of preferred organosilane compounds suitable for use in the context of the present invention, mention can be made in particular of:
compounds having formula (Va), wherein:
X is $NH_2$, and
L is $CH_2CH_2CH_2$ and R is $CH_3$ (compound named (3-aminopropyl)-trimethoxy-silane or APTMS);
or L is $CH_2CH_2CH_2$ and R is $CH_3CH_2$ (compound named (3-aminopropyl)-triethoxy-silane or APTES);
or L is $CH_2CH_2NHCH_2CH_2$ and R is $CH_3$ (compound named [3-(2-aminoethyl)aminopropyl]trimethoxy-silane or DATMS or DAMO);
X is SH; L is $CH_2CH_2CH_2$ and R is $CH_2$—$CH_3$ (compound named (3-Mercaptopropyl)trimethoxysilane or MPTES);
or X is $C_6H_5N$; L is $CH_2CH_2$ and R is $CH_2$—$CH_3$ (compound named 2-(4-Pyridylethyl)triethoxysilane or PETES);
or X is $CHCH_2O$; L is $CH_2CH_2CH_2$ and R is $CH_3$ (compound named (3-Glycidoxypropyl)trimethoxysilane or EPTMS);
or X is Cl; L is $CH_2CH_2CH_2$ and R is $CH_3$ (compound named 3-Chloropropyltrimethoxysilane or CPTMS).

A particularly preferred organosilane compound in the context of the present invention is 3-aminopropyl-trimethoxy-silane (APTMS).

Advantageously the bifunctional organic binder is present in the activated solution in a quantity generally comprised between $10^{-5}$ M and $10^{-1}$ M, preferably between $10^{-4}$ M and $10^{-2}$ M, still more preferably between $5\times10^{-4}$ M and $5\times10^{-3}$ M.

According to a particular feature of the invention, the activation solution is free of compound comprising at least two glycidyl functions or of a compound comprising at least two isocyanate functions.

The solvent system of the solution according to the present invention must be suitable for solubilizing the activator and the binder defined above.

The solvent system may consist of one or more solvents selected from the group consisting of N-methylpyrrolidinone (NMP), dimethylsulphoxide (DMSO), alcohols, ethyleneglycol ethers such as for example monoethyl-diethyleneglycol, propyleneglycol ethers, dioxane and toluene.

In general, the solvent system advantageously consists of a mixture of a solvent suitable for solubilising the palladium complex in combination with a solvent such as an ethyleneglycol ether or a propyleneglycol ether.

A particularly preferred solvent solution in the context of the present invention, particularly due to its very low toxicity, consists of a mixture of N-methylpyrrolidinone (NMP) and monoethyl ether of diethyleneglycol. These compounds can be used in a volume) comprised between 1:200 and 1:5, preferably about 1:10.

A particularly preferred activation solution in the context of the present invention contains:
an activator consisting of one or more palladium complexes selected from the group consisting of:
complexes having the formula (I), wherein:
R1 is H, R2 is $CH_2CH_2NH_2$ and X is Cl, a complex named (diethylenetriamine)(dichloro)palladate (II);
R1 and R2 are identical and are $CH_2CH_2OH$ and X is Cl, a complex named (N,N'-bis(2-hydroxyethyl)ethylenediamine)-(dichloro)palladate (II);
complexes having the formula (IIa) wherein:
R1 is H, R2 is $CH_2CH_2NH_2$ and Y is two Cl, a complex named trans-bis(diethylenetriamine)palladate (II);
complexes having the formula (IIb) wherein:
R1 is H, R2 is $CH_2CH_2NH_2$ and Y is two Cl, a complex named cis-bis(diethylenetriamine)palladate (II);
at a concentration of $5\times10^{-5}$ M to $5\times10^{-4}$ M.
a binder consisting of one or more organosilane compounds selected from the group consisting of compounds having formula (Va) wherein:
X is $NH_2$ and
L is $CH_2CH_2CH_2$ and R is $CH_3$ (APTMS);
or L is $CH_2CH_2CH_2$ and R is $CH_2CH_3$ (APTES);
or L is $CH_2CH_2NHCH_2CH_2$ and R is $CH_3$ (DATMS or DAMO);
X is SH; L is $CH_2CH_2CH_2$ and R is $CH_2CH_3$(MPTES);
or X is $C_6H_5N$; L is $CH_2CH_2$ and R is $CH_2CH_3$(PETES);
or X is $CHCH_2O$; L is $CH_2CH_2CH_2$ and R is $CH_3$ (EPTMS);
or X is Cl; L is $CH_2CH_2CH_2$ and R is $CH_3$ (CPTMS);
at a concentration comprised between $10^{-3}$ M and $10^{-2}$ M.

According to a second aspect, the present invention relates to the use of a solution as described above, for activating the surface of a substrate, in particular a silicon-containing substrate, for its subsequent coating by a metal layer deposited by the electroless method, the said surface consisting exclusively of one or more oxides.

The substrate of which the surface can be activated by the implementation of the present invention may in particular be a semiconductor substrate containing silicon, in particular for the fabrication of an electronic device and more particularly of through vias for three-dimensional integrated circuits.

The substrate surface to be activated consists of an oxide, advantageously compatible with the electronic technology. Such a surface preferably consists of silica ($SiO_2$) but may also consist of any oxide having a low dielectric constant such as for example SiOC, SiOCH, SiON, SiOCN or SiOCHN.

According to a third aspect, the present invention relates to a method for activating the oxidized surface of a substrate for its subsequent coating by a metal layer deposited using an electroless method, said surface consisting of one or more oxides in particular of (a) silicon oxide(s), characterized in that it consists in contacting said concentrated surface with a solution as defined above.

Preferably, this activation method is carried out at a temperature comprised between 50 and 90° C., for a period of 1 to 30 minutes, and still more preferably at a temperature comprised between 65 and 70° C., for a period of 5 to 15 minutes.

The substrate surface is advantageously contacted with the activation solution according to the present invention by immersing the substrate coated with the oxide layer in the activation solution.

Advantageously, prior to it contacting with the activation solution, the oxidized surface of the substrate is subjected to a surface treatment for promoting the presence of a hydroxyl group on the surface. This treatment generally comprises the following steps:

a) treating the surface by an acidic solution such as piranha mixture ($H_2O_2/H_2SO_4$ 20/50 (v/v)) for a period of between 30 minutes and 90 minutes, for example about 60 minutes, at a temperature between 60 and 90° C., for example about 70° C.;

b) treating the surface thus obtained with water, preferably deionized, for a period of 30 minutes to 90 minutes, for example about 60 minutes, at a temperature comprised between 60 and 90° C., for example about 70° C.;

c) drying the surface thus treated, for example under a nitrogen stream. Alternatively, this prior treatment of the oxidized surface of the substrate may be a UV treatment at 28 000 $\mu W/cm^2$ for a wavelength of 254 nm under an ozone stream for 10 to 30 minutes, preferably 15 minutes.

Finally, according to a fourth aspect, the present invention relates to a method for manufacturing an electronic device, comprising the steps of:

a) activating the oxidized surface of a substrate such as in particular a silicon-containing substrate, said surface consisting of one or more oxides, in particular of (a) silicon oxide(s), by contacting said surface with a solution as previously defined, preferably at a temperature comprised between 50 and 90° C., for a period of 1 to 30 minutes, and still more preferably at a temperature comprised between 65 and 70° C., for a period of 5 to 15 minutes; and b) coating said surface thus activated by an electroless deposition of a metal layer, in particular using nickel.

Such a method is particularly useful for fabricating through vias for three-dimensional integrated circuits in which the surface of an electricity conducting or semiconducting substrate is successively coated with a first internal layer of an oxide, in particular silicon, forming an electrical insulating film, and a metal intermediate layer forming a copper diffusion barrier, and an outer copper seed layer.

The method according to this fourth aspect of the invention can use any metal which can be electrolessly deposited on the activated surface of the substrate.

For the preferred applications of the invention, the metal preferably used is selected from noble metals and transition metals, and alloys thereof. These metals may be alloyed with elements such as phosphorous or boron or a mixture of these compounds.

Such materials, and in particular nickel-based or cobalt-based materials, constitute particularly advantageous barrier layers for preventing the migration or diffusion of a copper.

Excellent results have been obtained in the context of the present invention with nickel alloyed with boron.

The electroless deposition of a metal a is a well known method to a person skilled in the art.

In the context of the present invention, the coating of the activated surface of the substrate is carried out by contacting the activated surface with a liquid solution, preferably aqueous, containing:

at least one metallic salt, preferably at a concentration comprised between $10^{-3}$ M and 1 M;

at least one reducing agent, preferably in a quantity comprised between $10^{-4}$ M and 1 M;

optionally, at least one stabilizer, preferably in a quantity comprised between $10^{-3}$ M and 1 M and an agent for adjusting the pH to a value comprised between 6 and 11, preferably between 8 and 10;

under conditions for forming a metallic film having a thickness of at least 30 nanometers, preferably comprised between 30 nanometers and 100 microns, still more preferably comprised between 70 nanometers and 200 nanometers.

Advantageously, the metallic salt of the aforementioned metal is a water-soluble salt selected from the group consisting of the acetate, acetylacetonate, hexafluoro-phosphate, nitrate, perchlorate, sulphate or tetrafluoroborate of the said metal.

A preferred metal salt, in the context of the present invention, is nickel sulphate hexahydrate.

Advantageously, the aforementioned reducing agent can be selected from the group consisting of hypophosphorous acid and salts thereof, boron derivatives, glucose, formaldehyde and hydrazine.

A preferred reducing agent in the context of the present invention is a derivative of borane such as, in particular, dimethylamino borane (DMAB).

The stabiliser can be selected from the group consisting of ethylene diamine, citric acid, acetic acid, succinic acid, malonic acid, aminoacetic acid, malic acid or an alkali metal salt of these compounds.

A preferred stabilizer in the context of the present invention is citric acid.

In general, the metal layer can be prepared by soaking in the aforementioned liquid solution, at a temperature comprised between 40 and 90° C., preferably at 70° C., for a period of 30 s to 20 min, according to the desired thickness of the layer.

According to an advantageous embodiment, this layer can be annealed at a temperature comprised between 200 and 400° C., preferably at 250° C., for a period of 1 min to 30 min, preferably about 10 min, under inert or reducing atmosphere.

In the context of the preferred applications of the invention, the method described above is supplemented with a step for the formation of an additional copper seed layer.

Advantageously, the aforementioned copper seed layer can be prepared by a deposition process by wet electrodeposition comprising:

a) contacting the metal surface of a substrate with a liquid solution comprising:
  at least one solvent;
  copper ions at a concentration comprised between 14 and 120 mM, preferably between 16 and 64 mM;
  ethylenediamine;
  the molar ratio between the ethylenediamine and the copper being comprised between 1.80 and 2.03;
  the pH of the said composition being comprised between 6.6 and 7.5;
b) the polarization of said surface for a sufficiently long period to form said copper seed layer.

According to a preferred embodiment, this liquid solution comprises those of the copper ions at a concentration comprised between 16 and 64 mM, the molar ratio comprised between the copper ions and the ethylenediamine preferably being comprised between 1.96 and 2.00.

Although in principle, there is no restriction concerning the type of solvent (provided that it sufficiently solubilizes the active species of the solution and does not interfere with the electrodeposition), it is preferably water.

In general, the source of copper ions is a copper salt such as in particular copper sulphate, copper chloride, copper nitrate, copper acetate, preferably copper sulphate, and still more preferably copper sulphate pentahydrate.

According to a preferred embodiment, the contacting of the surface to be coated with the liquid solution is carried out without electric polarization, that is without imposing an electric current or electric potential with regard to a counter-electrode or with regard to a reference electrode to this surface, prior to the electrodeposition step.

In principle, there is no restriction on the step of separating the substrate coated with this copper seed layer after the formation of the coating.

In this method, the step of forming the coating by electrodeposition is carried out for a sufficiently long period to form the desired coating. This period can easily be determined by a person skilled in the art, because the growth of the film is a function of the charge which is equal to the time integral of the electric current passing through the circuit during the deposition time (Faraday's law).

During the coating formation step, the surface to be coated may be polarized, either in galvanostatic mode (fixed imposed current), or in potential static mode (imposed and fixed potential, possibly with regard to a reference electrode), or even in pulsed mode (current or voltage).

In general, it has been observed that a particularly satisfactory coating can be obtained by polarization in pulsed mode, preferably in order to impose current slots.

In general, this step can be carried out by imposing current slots corresponding to a maximum current per unit area comprised in a range of from 0.6 mA·cm$^{-2}$ to 10 mA·cm$^{-2}$, and more particularly from 1 mA·cm$^{-2}$ to 5 mA·cm$^{-2}$ and to a minimum current per unit area comprised in a range of from 0 mA·cm$^{-2}$ to 5 mA·cm$^{-2}$, and preferably of 0 mA·cm$^{-2}$.

More particularly, the maximum current polarization time may be comprised between $2\times10^{-3}$ and 1.6 seconds, preferably between 0.1 and 0.8 seconds, for example about 0.36 second, while the minimum current polarization time may be comprised between $2\times10^{-3}$ and 1.6 seconds, preferably between 0.1 and 0.8 second, for example about 0.24 second.

The number of cycles to be carried out during this step depends on the desired thickness of the coating.

In general, a person skilled in the art can easily determine the number of cycles to be carried out, knowing that under the abovementioned preferable conditions it has been observed that the deposition rate is about 0.3 nm per second.

This method has served to prepare copper seed layers having a thickness comprised between 50 nm and 1 µm, preferably between 200 and 800 nm, for example about 300 nm, on the metal surface forming a copper diffusion barrier in a through via type of structure.

The invention will be better understood from a reading of the description of the following non-limiting exemplary embodiments, provided in conjunction with the appended figures which respectively represent:

FIG. 1: Schematic representation of a galvano-pulsed protocol usable for the formation of a copper seed layer.

Figure 2:
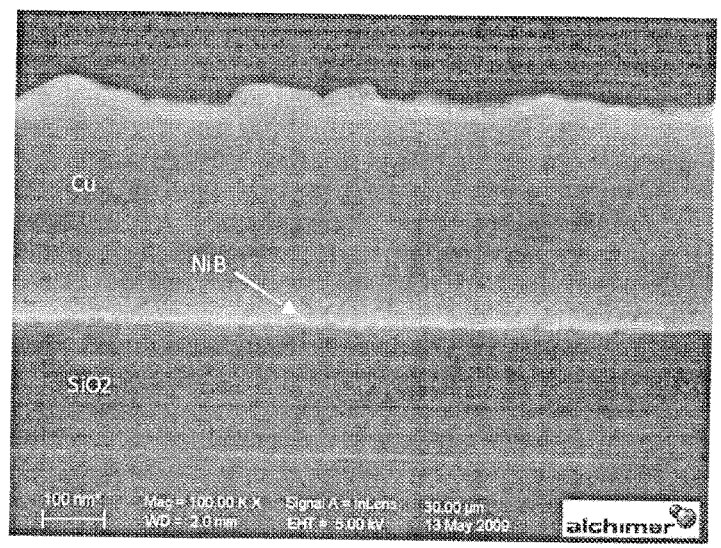

FIG. 2: Scanning electron microscopy of a Si—SiO$_2$—NiB—Cu stack obtained in example 1.

Figure 3:
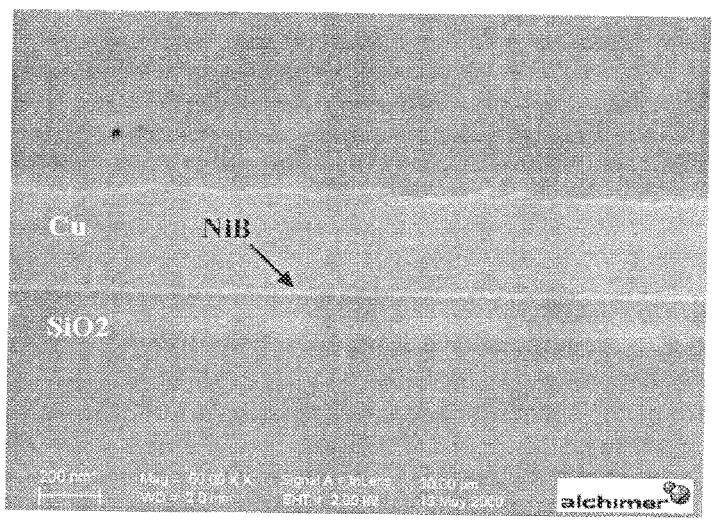

FIG. 3: Scanning electron microscopy of a Si—SiO$_2$—NiB—Cu stack obtained in example 4.

The following examples were obtained on the laboratory scale. Unless otherwise indicated, these examples were prepared under standard temperature and pressure conditions (about 25° C. under about 1 atmosphere) in ambient air, and the reactants used were obtained directly on the market without further purification.

In these examples, the following abbreviations have been used:
  g/l: grams per liter;
  m/m: mass per mass;
  min: minute.

EXAMPLE 1

Activation for Electroless Deposition, of a Substrate Coated with a Silicon Dioxide Layer SiO$_2$ from a Solution According to the Invention Containing a Palladium Complex and an Amino Silane Type of Compound a) Cleaning of the Surfaces In this example, the substrate used was a silicon coupon with 4 cm sides (4*4 cm) and 750 µm thick coated with a layer of silicon dioxide (SiO$_2$) having a thickness of about 300 nm. The samples were placed in a solution containing 50 ml of concentrated sulphuric acid (H$_2$SO$_4$) and 20 ml of hydrogen peroxide (H$_2$O$_2$) for 30 minutes at 70° C., and then in deionized water at 70° C. for 30 minutes, to promote the presence of hydroxyl groups on the surface of the silicon dioxide. The samples were then rinsed abundantly with deionized water before being activated according to b).

b) Activation of the Substrate Surface:
  b1) Preparation of the Palladium Complex:
  In a 250 ml single-necked flask, 802 mg (4.52 mmoles) of palladium chloride PdCl$_2$, 50 ml of deionized water and 1 ml of concentrated hydrochloric acid (37%, d=17), or an acid concentration of 0.2 M, were introduced. The mixture was heated at 60° C. for 20 minutes to dissolve the palladium chloride and thereby obtain a brownish-red solution of H$_2$PdCl$_4$.

0.500 ml (4.58 mmoles) of diethylene triamine was added to the solution thus obtained. This addition caused a change in colour of the solution from brownish-red to orange yellow.

The reaction medium was maintained at 60° C. for an additional 2 h.

The solvent was evaporated in a rotary evaporator. The remaining solid was recrystallized in hot ethanol to obtain 1.268 g of a palladium complex having the formula C$_4$H$_{13}$N$_3$PdCl$_2$ in the form of yellowish needles (yield=88%). NMR $^1$H (D$_2$O): 2.62 (ddd, 2H); 2.82-2.94 (m, 4H); 3.02 (td, 2H).

b2) Preparation of the Activation Solution According to the Invention:

8 mg of the complex obtained after step b1) were dissolved in 10 ml of N-methyl pyrrolidinone (NMP).

In a clean and dry beaker, 50 ml of monoethyl ether of diethylene glycol, was introduced, plus 10 ml of the aforementioned NMP solution containing the palladium complex and 0.6 ml of aminopropyl trimethoxy slime (APTMS, purity 95%). The mixture was stirred.

b3) Treatment of the Substrate Surface:

The mixture obtained after aforementioned step b2) was heated to about 65° C. and the substrate prepared in step a) described above was immersed therein for about 10 minutes. The substrate thus treated was then abundantly rinsed with deionized water and dried under nitrogen stream. This operation was carried out for three samples at the time considered as t=0. The solution was allowed to return to ambient temperature and was stored in a desiccator. Three samples prepared according to step a) were immersed at t=6.5 hours in the same solution again heated to 65° C. After storage in a desiccator, the operation was repeated at time t=15 hours. All the treated samples were rinsed abundantly with deionized water and then subjected to the following treatments.

In the following description, the term "substrate" therefore means each of the substrates thus treated.

c) Electroless Deposition of a Metal Layer of NiB c1) Extemporaneous Preparation of the Electroless Solution:

In a 1 liter container, 31.11 g of nickel sulphate hexahydrate (0.118 moles), 44.67 g of citric, acid (0.232 moles) and 58 g de N-methyl-ethanolamine (0.772 moles) were introduced successively. The final pH was adjusted to 9 with the base and the total volume was adjusted to 1 liter with distilled water. The solution was stabilized with 0.111 g of thiodiglycolic acid (0.739 mmoles).

To nine volumes of the aforementioned solution, just before carrying out the next step, a volume of reducing solution was added comprising 28 g/l of dimethyl-amino borane (DMAB; 0.475 moles).

c2) Formation of a Metal Layer of NiB to Form the Diffusion Barrier:

A metal layer of NiB was prepared on the "activated" surface of the substrate obtained after step b) by soaking in the electroless solution previously prepared and heated to 70° C., for a period of 30 seconds to 20 minutes, according to the desired thickness. In this example, the duration of the soaking was 5 min to obtain a metal layer thickness of about 70 nm.

The metal layer thus obtained was annealed at 250° C. for 10 minutes under reducing atmosphere ($N_2+H_2$ mixture (5% $H_2$)).

d) Formation of a Copper Seed Layer:
Solution:

The deposition of a copper seed layer on the substrate coated after step c) was carried out using an aqueous electrodeposition solution containing 2.1 ml·l$^{-1}$ (32 mM) of ethylenediamine and 4 g·l$^{-1}$ (16 mM) of $CuSO_4(H_2O)_5$.

Protocol:

The electrodeposition method employed in this example comprised a copper growth step during which the treated substrate obtained after step c) was cathodically polarized in galvano-pulsed mode and simultaneously rotated at a speed of 40 revolutions per minute.

FIG. 1 shows in detail the galvano-pulsed protocol used, with a total period P of 0.6 s; a polarization time Ton of 0.36 s during which a current per unit area of 2.77 mA·cm$^2$ was imposed; a rest time Toff without polarization of 0.24 s. The duration of this step depends, as may be understood, on the desired thickness of the seed layer. This duration can easily be determined by a person skilled in the art, since the growth of the film is a function of the charge passed into the circuit. Under the aforementioned conditions, with a deposition rate of about 1.5 nm per coulomb of charge passed into the circuit, a duration of the electrodeposition step of about 15 minutes served to obtain a coating having a thickness of about 300 nm.

The substrate thus coated with copper was removed from the electrodeposition solution at zero speed of rotation in about 2 seconds and then rinsed with deionized water and dried under nitrogen stream.

Adhesion Measurement:

The adhesion values in J/m$^2$ were measured using an MTS synergy 100 tensile machine (Cofrac). The tensile apparatus is connected to a force sensor travelling vertically along a crossbeam. The measurement ranges are between 1 and 20 J/m$^2$.

Results:

For all the samples prepared according to this example, the adhesion measured by this protocol was higher than 20 J/m$^2$ (Table 1, entries 1, 2 and 3), characterizing a total absence of detachment of the layers after the tensile test. The activation solution according to the invention is therefore effective and its efficiency does not diminish over time, at least for a period compatible with industrial use. No precipitate was observed in the activation solution after 15 hours.

EXAMPLE 2

Activation for Electroless Deposition, of a Substrate Coated with Aluminium Oxide of the $Al_2O_3$ Type from a Solution According to the Invention Containing a Palladium Complex and an Amino-Silane Compound a) Cleaning of Surfaces In this example, the substrate used was aluminium coupon with 4 cm sides (4*4 cm) and 750 μm thick coated with a layer of aluminium oxide of type $Al_2O_3$ with a thickness of 5 nm. The cleaning was carried out at the same conditions as in example 1.

b) Activation of the Substrate Surface:

The activation solution was identical to the one used for example 1.

c) Electroless Deposition of a Metal Layer of NiB

The NiB layer was deposited in the same way as in example 1.

d) Formation of a Copper Seed Layer:

The copper seed layer was deposited in the way as in example 1.

Results:

The adhesion measured in this example was higher than 20 J/m$^2$ (Table 1, entry 4), characterizing a total absence of detachment of the layers after the tensile test. No precipitate was observed in the activation solution.

COMPARATIVE EXAMPLE 3

Activation for Electroless Deposition of a Substrate Coated with a Silicon Dioxide Layer $SiO_2$ from a Solution According to patent application WO/2009/986230 Containing a Palladium Compound, an Amino-Silane Compound and a Water-Acetonitrile Mixture For comparison, example 1 was reproduced using an activation solution obtained from a commercial palladium salt in the presence of water, as described in patent application WO/2009/086230.

a). A Cleaning of Surfaces

The surfaces were cleaned under the same conditions as in example 1.

b) Activation of the Substrate Surface:

The activation solution was prepared by dissolving 4 mg (0.014 mmoles or 0.065 g/l) of $Na_2PdCl_4$ in 2.5 ml of water (4% m/m), 60 ml acetonitrile (95% m/m) and 0.6 ml of aminopropyl trimethoxy silane (APTMS, purity 95%, 1% m/m). The $SiO_2$ samples were immersed for 10 minutes at 65° C. in this activation solution. An abundant white precipitate was observed after a few minutes in the activation solution, characteristic of the polymerization of the silane compound in the presence of water.

e) Electroless Deposition of a Metal Layer of NiB

The samples obtained after aforementioned step b) were treated following the protocol described in step c) of example 1. No metal deposit was observed after this step (Table 1, entry 5).

COMPARATIVE EXAMPLE 4

Activation for Electroless Deposition of a Substrate Coated with a Silicon Dioxide Layer $SiO_2$, from a Solution According to patent application WO/2009/086230 Containing a Palladium Compound, an Amino-Silane Compound and a Water-DMSO Mixture For comparison, comparative example 3 was reproduced using an activation solution obtained from a commercial palladium salt in the presence of water and by replacing the acetonitrile by dimethyl-sulphoxide (DMSO), as described in patent application WO/2009/086230.

a) Cleaning of Surfaces

The cleaning was carried out under the same conditions as in example 1.

b) Activation of the Substrate Surface:

The activation solution was prepared by dissolving 4 mg (0.014 mmoles or 0.065 g/l) of $Na_2PdCl_4$ in 2.5 ml of water (4% m/m), 60 ml of DMSO (95% m/m) and 0.6 ml of aminopropyl trimethoxy silane (APTMS, purity 95%, 1% m/m). The samples were immersed for 10 minutes at 65° C. in this activation solution (t=0) and then rinsed abundantly with deionized water before being dried under nitrogen stream. The activation solution was stored in a desiccator. After one hour (t=1 hour), the activation solution was heated again to 65° C. and new samples of $SiO_2$ were immersed therein for 10 minutes and then rinsed abundantly with deionized water. The same protocol was repeated after two hours (t=2 hours). An abundant supernatant white precipitate was observed in the activation solution after one hour, characteristic of the polymerization of the silane compound in the presence of water.

c) Electroless Deposition of a Metal Layer of NiB

The samples obtained after aforementioned step b) were treated following the protocol described in step c) of example 1. In this example, the formation of a metallic film was observed as expected, for the samples prepared at t=0 and at t=1 hour.

d) Formation of a Copper Seed Layer:

The deposition of the copper seed layer was carried out in the same way as in example 1.

Results:

The adhesion result showed that at time t=0, the adhesion is higher than 20 $J/m^2$ (Table 1, entry 6), but decreases to 12.7 $J/m^2$ (Table 1, entry 7) for the samples prepared at t=1 hour. A salting out of palladium was also observed in the electroless solution during the passage of the sample at t=1 hour. This salting out caused the destabilization of the electroless solution, which precipitated abundantly. This observation confirmed the poor adhesion of palladium to the substrate surface due to the destabilization of the activation solution (formation of a white precipitate of polysilane). After two hours, no metal deposit was observed (Table 1, entry 8). The activation solution was therefore more active after one hour.

COMPARATIVE EXAMPLE 5

Activation for Electroless Deposition of a Substrate Coated with a Silicon Dioxide Layer $SiO_2$ from a Solution According to patent application WO/2009/086230 Containing a Copper Compound, an Amino-Silane Compound and a Water-DMSO Mixture For comparison, comparative example 4 was reproduced by replacing the palladium compound by a copper compound as mentioned in patent application WO/2009/086230.

a) Cleaning of Surfaces

The cleaning was carried out in same conditions as in example 1.

b) Activation of the Substrate Surface:

The activation solution was prepared by dissolving 5.9 mg of $CuSO_4$, $5H_2O$ (0.094 g/l) in 2.5 ml of water (4% m/m), 60 ml of DMSO (95% m/m) and 0.6 ml of aminopropyl trimethoxy silane (APTMS, purity 95%, 1% m/m). The samples were immersed for 10 minutes at 65° C. in this activation solution (t=0) and then rinsed abundantly with deionized water before being dried under nitrogen stream. An abundant blue precipitate was observed in the activation solution after a few seconds, characteristic of the polymerization of the silane compound in the presence of water.

c) Deposition of Electroless Deposition of Metallic Layer NiB

The deposition of the NiB layer was carried out in the same way as in example 1. In this example, no metal film formation was observed (Table 1, entry 9).

TABLE 1

| Entry | Substrate surface | Activation solution | Time after preparation of activation solution (h) | Adhesion $(J \cdot m^2)$ |
|---|---|---|---|---|
| 1 | $SiO_2$ | According to example 1 | 0 | >20 |
| 2 | $SiO_2$ | According to example 1 | 6.5 | >20 |
| 3 | $SiO_2$ | According to example 1 | 15 | >20 |
| 4 | $Al_2O_3$ | According to example 2 | 0 | >20 |
| 5 | $SiO_2$ | According to comparative example 3 | 0 | No metal deposit |
| 6 | $SiO_2$ | According to comparative example 4 | 0 | >20 |
| 7 | $SiO_2$ | According to comparative example 4 | 1 | 12.7 |
| 8 | $SiO_2$ | According to comparative example 4 | 2 | No metal deposit |
| 9 | $SiO_2$ | According to comparative example 5 | 0 | No metal deposit |

The results given in Table 1 above show that the solutions according to the present invention clearly serve to activate the oxidized dielectric surface of the substrate, such as a semiconductor substrate, for its subsequent coating with a metal layer deposited by the electroless method, followed by a copper seed layer, and giving rise to multilayer structures having excellent inter-layer adhesion.

These results also show that unlike the known compositions of the prior art, these solutions preserve their effectiveness over time for a period of at least 15 hours, compatible with their use on the industrial scale.

EXAMPLE 6

Activation for Electroless Deposition of a Substrate Coated with a Silicon Dioxide ($SiO_2$) Layer from a Solution According to the Invention Containing a Palladium Complex and a Thiosilane Compound a) Cleaning of the Surfaces:
The cleaning was carried out under the same conditions as in example 1.
b) Activation of the Substrate Surface:
  b1) Preparation of the Activation Solution
  8 mg of the complex obtained from step b1) of example 1 were dissolved in 10 ml of N-methyl pyrrolidinone (NMP).
  50 ml of diethylene glycol monoethyl ether, 10 ml of the abovementioned NMP solution containing the palladium complex and 0.6 ml of (3-mercaptopropyl)trimethoxysilane (3MPTMS: purity 95%) were introduced into a clean dry beaker. The mixture was stirred.
  b2) Treatment of the Substrate Surface
  The treatment of the substrate surface was carried out in the same way as in example 1.
c) Electroless Deposition of a Metal Layer of NiB
The layer of NiB was deposited in the same way as in example 1.
d) Formation of a Copper Seed Layer:
The deposition of the copper seed layer was carried out in the same way as in example 1.
Results:
The adhesion measured in this example was higher than 20 $J/m^2$, characterizing a total absence of detachment of the layers after the tensile test. No precipitate was observed in the activation solution.

EXAMPLE 7

Activation for Electroless Deposition of a Substrate Coated with a Layer of Silicon Dioxide $SiO_2$ from a Solution According to the Invention Containing a Palladium Complex and a Pyridylsilane Compound a) Cleaning of the Surfaces
The cleaning was carried out under the same conditions as in example 1.
b) Activation of the Substrate Surface:
  b1) Preparation of the Activation Solution
  8 mg of the complex obtained after step b1) of example 1 were dissolved in 10 ml of N-methyl pyrrolidinone (NMP).
  50 ml of diethylene glycol monoethyl ether, 10 ml of the abovementioned NMP solution containing the palladium complex and 0.6 ml of 2-(4-pyridylethyl)triethoxysilane (PETES: purity 95%) were introduced into a clean dry beaker. The mixture was stirred.
  b2) Treatment of the Substrate Surface
  The treatment of the substrate surface was carried out in the same way as in example 1.
c) Electroless Deposition of a Metal Layer of NiB
The layer of NIB was deposited in the same way as in example 1.
d) Formation of a Copper Seed Layer:
The deposition of the copper seed layer was carried out in the same way as in example 1.
Results:
The adhesion measured in this example was higher than 20 $J/m^2$, characterizing a total absence of detachment of the layers after the tensile test. No precipitate was observed in the activation solution.

EXAMPLE 8

Activation for Electroless Deposition of a Substrate Coated with a Layer of Silicon Dioxide $SiO_2$ from a Solution According to the Invention Containing a Palladium Complex and a Glycidylsilane Compound a) Cleaning of the Surfaces
The cleaning was carried out under the same conditions as in example 1.
b) Activation of the Substrate Surface:
  b1) Preparation of the Activation Solution
  8 mg of the complex obtained after step b1) of example 1 were dissolved in 10 ml of N-methyl pyrrolidinone (NMP).
  50 ml of diethylene glycol monoethyl ether, 10 ml of the abovementioned NMP solution containing the palladium complex and 0.6 ml of (3-glycidoxypropyl)trimethoxysilane (GPTMS: purity 95%) were introduced into a clean dry beaker. The mixture was stirred.
  b2) Treatment of the Substrate Surface
  The treatment of the substrate surface was carried out in the same way as in example 1.
c) Electroless Deposition of a Metal Layer of NiB
The layer of NiB was deposited in the same way as in example 1.
d) Formation of a Copper Seed Layer:
The deposition of the copper seed lay carried out in the same way as in example 1.
Results:
The adhesion measured in this example was higher than 20 $J/m^2$, characterizing a total absence of detachment of the layers after the tensile test. No precipitate was observed in the activation solution.

EXAMPLE 9

Activation for Electroless Deposition of a Substrate Coated with a Layer of Silicon Dioxide $SiO_2$ and Comprising Through-Vias 5 μm in Diameter and 50 μm in Depth from a Solution According to the Invention Containing a Palladium Complex and an Aminosilane Compound a) Cleaning of the Surfaces
  In this example, the substrate used was a silicon coupon with 4 cm sides (4×4 cm) and 750 μm thick coated with a layer of silicon dioxide ($SiO_2$) having a thickness of about 300 nm and comprising through-vias 5 μm in diameter and 50 μm in depth. The samples were placed in a solution containing 50 ml of concentrated sulphuric acid ($H_2SO_4$) and 20 ml of hydrogen peroxide ($H_2O_2$) for 30 minutes at 70° C., and then in deionized water at 70° C. for 30 minutes, to promote the presence of hydroxyl groups on the surface of the silicon dioxide. The samples were then rinsed abundantly with deionized water before being activated according to b).
b) Activation of the Substrate Surface:
  The activation solution was identical to the one used in example 1.

c) Electroless Deposition of a Metal Layer of NiB

The deposition of the NiB layer was carried out in the same way as in example 1. In order to guarantee good wettability of the solution inside the vias, short periods (3 seconds) of ultrasound were used during the electroless deposition.

d) Formation of a Copper Seed Layer:

The deposition of the copper seed layer was carried out in the same way as in example 1.

Results:

The adhesion measured in this example was higher than 20 J/m², characterizing a total absence of detachment of the layers after the tensile test. No precipitate was observed in the activation solution. The covering of the vias revealed excellent uniformity of the deposit on all the vias. The thicknesses measured at the bottom of the vias corresponded to 67% of the thickness measured on the surface.

The invention claimed is:

1. Solution for activating the oxidized surface of a substrate, in particular a silicon-containing substrate, for its subsequent coating by a metal layer deposited using an electroless method, characterized in that it contains:
A) an activator consisting of one or more palladium complexes selected from the group consisting of:
palladium complexes having the formula (I)

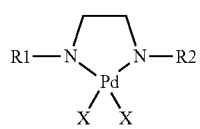

(I)

wherein:
R1 and R2 are identical and are —H; —CH$_2$CH$_2$NH$_2$; —CH$_2$CH$_2$OH;
or R1 is H and R2 is —CH$_2$CH$_2$NH$_2$;
or R1 is —CH$_2$CH$_2$NH$_2$ and R2 is —CH$_2$CH$_2$NHCH$_2$CH$_2$NH$_2$;
or R1 is —H and R2 is —CH$_2$CH$_2$NHCH$_2$CH$_2$NHCH$_2$CH$_2$NH$_2$;
X is a ligand selected from the group consisting of Cl$^-$; Br$^-$; I$^-$; H$_2$O, NO$_3^-$; CH$_3$SO$_3^-$; CF$_3$SO$_3^-$; CH$_3$-Ph-SO$_3^-$; CH$_3$COO$^-$ palladium complexes having the formula IIa or IIb

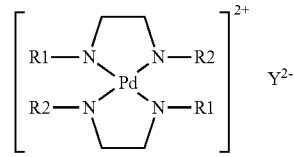

(IIa)

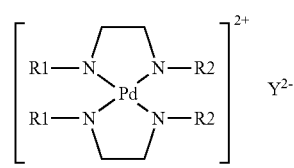

(IIb)

wherein:
R1 and R2 are as defined above and
Y is a counter-ion comprising two negative charges consisting of:

either two monoanions, preferably selected from the group consisting of Cl$^-$; PF$_6^-$; BF$_4^-$; NO$_3^-$; CH$_3$SO$_3^-$; CF$_3$SO$_3^-$; CH$_3$C$_6$H$_4$SO$_3^-$; CH$_3$COO$^-$; or a dianion, preferably SO$_4^{2-}$;

B) a bifunctional organic binder consisting of one or more organosilane compounds having
the general formula:

$$\{X\text{-}(L)\}_{4-n}\text{-Si}(OR)_n \quad (Va)$$

wherein:
X is a functional group selected from the group consisting of thiol, pyridyle, epoxy (oxacyclopropanyle), glycidyle, primary amine, chlorine and being able to react with palladium compounds of formula 1;
L is a spacer selected from the group consisting of CH$_2$; CH$_2$CH$_2$; CH$_2$CH$_2$CH$_2$; CH$_2$CH$_2$CH$_2$CH$_2$; CH$_2$CH$_2$NHCH$_2$CH$_2$; CH$_2$CH$_2$CH$_2$NHCH$_2$CH$_2$; CH$_2$CH$_2$CH$_2$NHCH$_2$CH$_2$NHCH$_2$CH$_2$; CH$_2$CH$_2$CH$_2$NHCH$_2$CH$_2$CH$_2$CH$_2$CH$_2$; Ph; Ph-CH$_2$; et CH$_2$CH$_2$-Ph-CH$_2$; (Ph representing a phenyl moiety);
R is a group selected from the group consisting of CH$_3$—, CH$_3$CH$_2$—, CH$_3$CH$_2$CH$_2$—, (CH$_3$)$_2$CH—; and
n is an integer equal to 1, 2 or 3;
or the general formula:

$$(OR)_3\text{Si-}(L)\text{-Si}(OR)_3 \quad (Vb)$$

wherein:
L is a spacer selected from the group consisting of CH$_2$CH$_2$CH$_2$NHCH$_2$CH$_2$NHCH$_2$CH$_2$CH$_2$ and CH$_2$CH$_2$CH$_2$—S—S—CH$_2$CH$_2$CH$_2$;
R is a group selected from the group consisting of CH$_3$—, CH$_3$CH$_2$—, CH$_3$CH$_2$CH$_2$—, (CH$_3$)$_2$CH—;
C) a solvent system consisting of one or more solvents suitable for solubilizing said activator and said binder.

2. Solution according to claim 1, characterized in that it is water-free or comprises water at a concentration lower than 0.5%, preferably lower than 0.2% and still more preferably lower than 0.1% by volume.

3. Solution according to claim 1, characterized in that it comprises:
said activator at a concentration comprised between $10^{-6}$ M and $10^{-2}$ M, preferably between $10^{-5}$ M and $10^{-3}$ M, still more preferably between $5 \times 10^{-5}$ M and $5 \times 10^{-4}$ M;
said binder at a concentration comprised between $10^{-5}$ M and $10^{-1}$ M, preferably between $10^{-4}$ M and $10^{-2}$ M, still more preferably between $5 \times 10^{-4}$ M and $5 \times 10^{-3}$ M.

4. Solution according to claim 1, characterized in that said bifunctional organic binder consists of one or more organosilane compounds having the formula (Va), wherein:
X is NH$_2$, and
L is CH$_2$CH$_2$CH$_2$ and R is CH$_3$ (compound named (3-aminopropyl)-trimethoxy-silane or APTMS);
or L is CH$_2$CH$_2$CH$_2$ and R is CH$_3$CH$_2$ (compound named (3-aminopropyl)-triethoxy-silane or APTES);
or L is CH$_2$CH$_2$NHCH$_2$CH$_2$ and R is CH$_3$ (compound named [3-(2-aminoethyl)aminopropyl]trimethoxy-silane or DATMS or DAMO);
X is SH; L is CH$_2$CH$_2$CH$_2$ and R is CH$_2$—CH$_3$ (compound named (3-Mercaptopropyl)trimethoxysilane or MPTES);
or X is C$_6$H$_5$N; L is CH$_2$CH$_2$ and R is CH$_2$—CH$_3$ (compound named 2-(4-Pyridylethyl)triethoxysilane or PETES);

or X is CHCH$_2$O; L is CH$_2$Cl$_2$CH$_2$ and R is CH$_3$ (compound named (3-Glycidoxypropyl)trimethoxysilane or EPTMS);

or X is Cl; L is CH$_2$CH$_2$CH$_2$ and R is CH$_3$ (compound named 3-Chloropropyltrimethoxysilane or CPTMS).

5. Solution according to claim 1, characterized in that said solvent system consists of one or more solvents selected from the group consisting of N-methylpyrrolidinone (NMP), dimethylsulphoxide (DMSO), alcohols, ethyleneglycol ethers such as for example monoethyl-diethyleneglycol, propyleneglycol ethers, dioxane and toluene.

6. Solution according to claim 1, characterized in that said activator consists of one or more palladium complexes selected from the group consisting of:
  complexes having the formula (I), wherein:
    R1 is H, R2 is CH$_2$CH$_2$NH$_2$ and X is Cl, a complex named (diethylenetriamine)(dichloro) palladate (II);
    R1 and R2 are identical and are CH$_2$CH$_2$OH and X is Cl, a complex named (N,N'-bis(2-hydroxyethyl)ethylenediamine)-(dichloro) palladate (II);
  complexes having the formula (IIa) wherein:
    R1 is H, R2 is CH$_2$CH$_2$NH$_2$ and Y is two CL, a complex named trans-bis(diethylenetriamine) palladate (II);
  complexes having the formula (IIb) wherein:
    R1 is H, R2 is CH$_2$CH$_2$NH$_2$ and Y is two Cl, a complex named cis-bis(diethylenetriamine) palladate (II);
at a concentration comprised between $5 \times 10^{-5}$ M and $5 \times 10^{-4}$ M.

7. Use of a solution according to claim 1, for activating the oxidized surface of a substrate, for its subsequent coating by a metal layer deposited by electroless means, said surface consisting exclusively of one or more oxides, in particular of (a) silicon oxide(s).

8. Method for activating the oxidized surface of a substrate for its subsequent coating by a metal layer deposited by electroless means, said surface consisting of one or more oxides in particular of (a) silicon oxide(s), characterized in that it consists in contacting said surface of said substrate with a solution according to claim 1, preferably at a temperature comprised between 50 and 90° C., for a period of 1 to 30 minutes, and still more preferably at a temperature comprised between 65 and 70° C., for a period of 5 to 15 minutes.

9. Method for manufacturing an electronic device, characterized in that it comprises the steps of:
  a) activating the oxidized surface of a substrate such as in particular a silicon-containing substrate, said surface consisting of one or more oxides, in particular of (a) silicon oxide(s), by contacting said surface with a solution according to claim 1, preferably at a temperature comprised between 50 and 90° C., for a period of 1 to 30 minutes, and still more preferably at a temperature comprised between 65 and 70° C., for a period of 5 to 15 minutes; and
  b) coating said surface thus activated by an electroless deposition of a metal layer, in particular using nickel.

10. Method according to claim 9, characterized in that said step b) is carried out by contacting the activated surface with a liquid solution, preferably aqueous, containing:
  at least one metallic salt, preferably at a concentration comprised between $10^{-3}$ M and 1 M;
  at least one reducing agent, preferably in a quantity comprised between $10^{-4}$ M and 1 M;
  optionally, at least one stabilizer, preferably in a quantity comprised between $10^{-3}$ M and 1 M and
  an agent for adjusting the pH to a value comprised between 6 and 11, preferably between 8 and 10;
under conditions for forming a metallic film having a thickness of at least 30 nanometers, preferably comprised between 30 nanometers and 100 microns, still more preferably comprised between 70 nanometers and 200 nanometers.

* * * * *